United States Patent
Furutani (10) Patent No.: US 7,812,687 B2
(45) Date of Patent: Oct. 12, 2010

(54) HIGH-FREQUENCY SWITCHING CIRCUIT MODULE

(75) Inventor: Koji Furutani, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/484,272

(22) Filed: Jun. 15, 2009

(65) Prior Publication Data

US 2009/0243703 A1   Oct. 1, 2009

Related U.S. Application Data

(63) Continuation of application No. PCT/JP2007/073303, filed on Dec. 3, 2007.

(30) Foreign Application Priority Data

Dec. 21, 2006   (JP) .............................. 2006-345058

(51) Int. Cl.
*H01P 1/15* (2006.01)
*H03H 7/01* (2006.01)
(52) U.S. Cl. ...................................... 333/103; 333/132
(58) Field of Classification Search .................. 333/101, 333/103, 124, 125, 126, 127, 128, 185, 132
See application file for complete search history.

(56) References Cited

U.S. PATENT DOCUMENTS

| | | | |
|---|---|---|---|
| 6,456,172 B1 | 9/2002 | Ishizaki et al. | |
| 7,057,472 B2 * | 6/2006 | Fukamachi et al. | 333/101 |
| 2004/0087286 A1 | 5/2004 | Inoue et al. | |
| 2004/0266378 A1 * | 12/2004 | Fukamachi et al. | 455/188.1 |
| 2005/0197095 A1 | 9/2005 | Nakamata et al. | |

FOREIGN PATENT DOCUMENTS

| | | |
|---|---|---|
| JP | 3029119 U | 9/1996 |
| JP | 08-330930 A | 12/1996 |
| JP | 10-093302 A | 4/1998 |
| JP | 10-093471 A | 4/1998 |

(Continued)

OTHER PUBLICATIONS

Official Communication issued in International Patent Application No. PCT/JP2007/073303, mailed on Feb. 5, 2008.

(Continued)

*Primary Examiner*—Dean O Takaoka
(74) *Attorney, Agent, or Firm*—Keating & Bennett, LLP (57) ABSTRACT

A high-frequency switching circuit module includes a high-frequency switch that includes an FET switching element and that selectively connects between a common input/output terminal and one of input/output terminals, and a matching circuit that is provided to the common input/output terminal Pc and is not provided to the input/output terminals. Although a non-selected input/output terminal of the high-frequency switch acts as a capacitor and the impedance between the common input/output terminal and a selected input/output terminal is displaced from a normal impedance, the displacement is corrected by the matching circuit connected to the common input/output terminal such that the impedance viewed from the common input/output terminal Pc to the high-frequency switch is made equal to the normal impedance. Accordingly, a high-frequency switching circuit module having a small overall size and achieving impedance matching for each terminal is provided.

7 Claims, 8 Drawing Sheets

FOREIGN PATENT DOCUMENTS

| | | |
|---|---|---|
| JP | 2001-086025 A | 3/2001 |
| JP | 2003-133882 A | 5/2003 |
| JP | 2004-187215 A | 7/2004 |
| JP | 2005-020140 A | 1/2005 |
| JP | 2005020140 A * | 1/2005 |
| JP | 2005-045345 A | 2/2005 |
| JP | 2005-064780 A | 3/2005 |
| JP | 2006-157423 A | 6/2006 |
| WO | 01/69807 A1 | 9/2001 |
| WO | 2006/057173 A1 | 6/2006 |

OTHER PUBLICATIONS

Official Communication issued in counterpart Japanese Application No. 2008-550085, mailed on Jun. 23, 2009.

Official Communication issued in corresponding European Patent Application No. 07832923.2, mailed on Jul. 16, 2010.

* cited by examiner

HIGH-FREQUENCY SWITCHING CIRCUIT MODULE

BACKGROUND OF THE INVENTION

1. Field of the Invention

The present invention relates to high-frequency switching circuits and, in particular, to a high-frequency switching circuit including a high-frequency switch that includes a field-effect transistor (FET) switching element.

2. Description of the Related Art

Japanese Unexamined Patent Application Publication No. 10-93302 discloses a high-frequency switching circuit including a high-frequency switch that includes an FET switching element and that selectively connects between a common input/output terminal and one of a plurality of input/output terminals.

Figure 1:
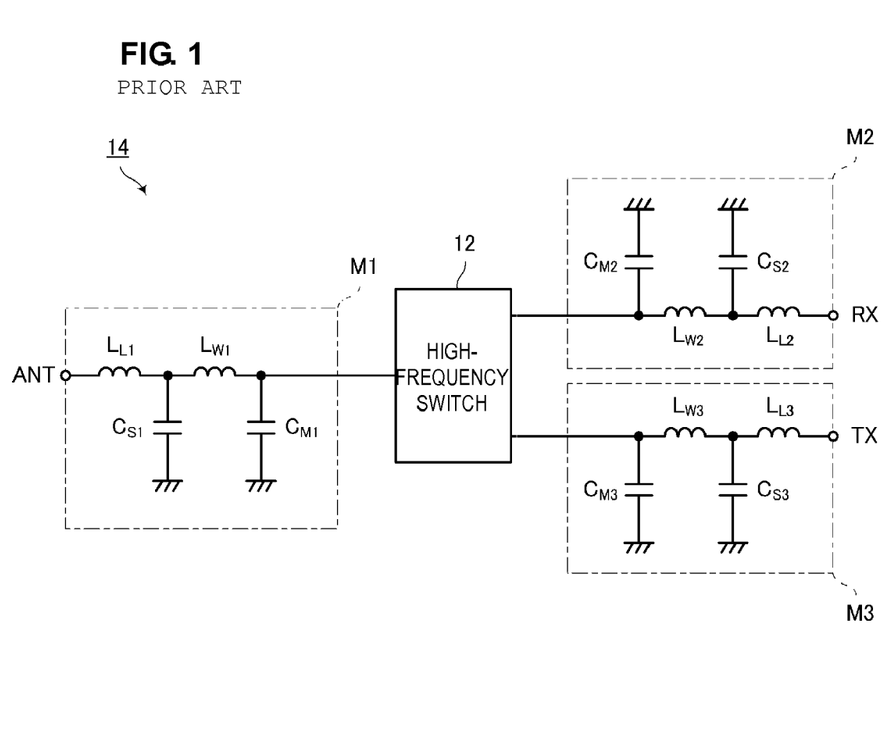
FIG. 1 illustrates a configuration of a high-frequency switching circuit disclosed in Japanese Unexamined Patent Application Publication No. 10-93302.

FIG. 1 is a circuit diagram of a high-frequency switching circuit illustrated in Japanese Unexamined Patent Application Publication No. 10-93302. The high-frequency switching circuit 14 includes an antenna terminal ANT arranged to be connected to an antenna, a reception-signal output terminal RX arranged to be connected to a receiving circuit, a transmission-signal input terminal TX arranged to be connected to a transmitting circuit, and a high-frequency switch 12 and is a circuit for switching between a transmission signal and a reception signal.

Matching circuits M1, M2, and M3 are disposed between the antenna terminal ANT and the high-frequency switch 12, between the reception-signal output terminal RX and the high-frequency switch 12, and between the transmission-signal input terminal TX and the high-frequency switch 12, respectively. The matching circuits M1, M2 and M3 perform impedance matching between the respective terminals and the high-frequency switch 12.

The high-frequency switch 12 is made of a semiconductor chip made of, for example, gallium arsenide (GaAs) The chip is bonded to each of the terminals with bonding wire (gold wire). Each of the matching circuits M1, M2 and M3 is designed in consideration of an electric inductance in the bonding wire.

In the matching circuit M1 illustrated in FIG. 1, an inductor $L_{L1}$ represents an inductance of a lead to the antenna terminal ANT, a capacitor $C_{S1}$ represents a stray capacitance between the lead of the antenna terminal ANT and the ground, and an inductor $L_{w1}$ represents a bonding-wire inductance. A bulk capacitor $C_{M1}$ is a metal-insulator-metal (MIM) capacitor.

Similarly, the matching circuits M2 and M3 include inductances $L_{L2}$ and $L_{L3}$ representing lead components, stray capacitances $C_{S2}$ and $C_{S3}$ between the leads of the respective terminals and the ground, bonding-wire inductances $L_{W2}$ and $L_{W3}$, and MIM capacitors $C_{M2}$ and $C_{M3}$, respectively.

However, to meet a requirement for miniaturization of a high-frequency switching circuit module, it is necessary to reduce the size of a high-frequency switch. In order to reduce the size, flip-chip mounting using bump connection is required.

The inductance of the bump portion in the above flip-chip mounting is significantly less than that in wire bonding. Thus, for the flip-chip mounting, imperfect matching occurs, and an extra line and chip inductor for achieving matching for each terminal is required.

SUMMARY OF THE INVENTION

To overcome the problems described above, preferred embodiments of the present invention provide a high-frequency switching circuit that has a small overall size and achieves impedance matching for each terminal.

A high-frequency switching circuit according to a preferred embodiment of the present invention includes a high-frequency switch that includes a field-effect transistor (FET) switching element and that selectively connects between a common input/output terminal and one of a plurality of input/output terminals.

The high-frequency switching circuit preferably includes matching circuit, the matching circuit being disposed between the common input/output terminal and a circuit connected to the common input/output terminal and not being disposed between the plurality of input/output terminals and a circuit connected to each of the plurality of input/output terminals.

The high-frequency switch preferably includes a semiconductor chip and is disposed on at least one major surface of a multilayer substrate by flip-chip mounting, the matching circuit preferably includes an inductor, and the inductor is provided on a first major surface of the multilayer substrate or inside the multilayer substrate.

The high-frequency switch preferably includes a semiconductor chip and is disposed on at least one major surface of a multilayer substrate by flip-chip mounting, the matching circuit preferably includes a chip inductor, the chip inductor is disposed on a first major surface of the multilayer substrate or inside the multilayer substrate.

A cavity is preferably provided in a second major surface of the multilayer substrate, and the semiconductor chip is preferably arranged in the cavity.

The matching circuit is preferably configured to correct a capacity component of the switching element being in an off state.

The circuit connected to at least one of the plurality of input/output terminals preferably includes a surface acoustic wave (SAW) filter.

The matching circuit is preferably disposed between the common input/output terminal and the circuit connected to the common input/output terminal and is not disposed between the plurality of input/output terminals and the circuit connected to each of the plurality of input/output terminals. Accordingly, as described below, impedance matching between the common input/output terminal and all of the other input/output terminals can be achieved, the high-frequency switch can be mounted by a method other than wire bonding, and its size can be reduced. Because the matching circuit is provided to only the common input/output terminal, the size can be further reduced, and insertion loss can also be reduced.

The high-frequency switch including the semiconductor chip is disposed on at least one major surface of the multilayer substrate by flip-chip mounting, and the inductor is disposed on the multilayer substrate defining a mounting board for the high-frequency switch (semiconductor chip). Accordingly, the overall size can be reduced.

The high-frequency switch including the semiconductor chip is disposed on at least one major surface of the multilayer substrate by flip-chip mounting, and the chip inductor being the matching circuit is mounted on the first major surface of the multilayer substrate. Accordingly, a case in which an inductor having a large inductance value is required can be supported, and the design freedom for the matching circuit can be increased.

The cavity is preferably provided in the second major surface of the multilayer substrate, and the semiconductor chip being the high-frequency switch is arranged in the cavity.

Accordingly, the high-frequency switching circuit having a reduced overall profile can be provided.

The matching circuit functions with the capacity of the switching element being in an off state and corrects the capacity component. Accordingly, the impedance between the common input/output terminal and a selected input/output terminal can be matched to the normal impedance, and the high-frequency switching circuit which achieves impedance matching can be provided.

The circuit connected to the at least one of the plurality of input/output terminals preferably includes the SAW filter. Accordingly, during design of the matching circuit, impedance mismatches caused by an electric capacitance in the SAW filter can also be cancelled. This eliminates the necessity to provide a matching circuit for the SAW filter itself. The high-frequency circuit including the SAW filter can have a small overall size, and insertion loss can be reduced.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 5(1) to 5(8) illustrate examples of electrode patterns disposed on dielectric layers of a multilayer substrate of the high-frequency switching circuit module according to the first preferred embodiment of the present invention.

FIGS. 6(9) to 6(15) illustrate examples of electrode patterns disposed on dielectric layers of a multilayer substrate of the high-frequency switching circuit module according to the first preferred embodiment of the present invention.

FIGS. 8(1) to 8(8) illustrate examples of electrode patterns disposed on dielectric layers of a multilayer substrate of the high-frequency switching circuit module according to the second preferred embodiment of the present invention.

FIGS. 9(9) to 9(13) illustrate examples of electrode patterns disposed on dielectric layers of a multilayer substrate of the high-frequency switching circuit module according to the second preferred embodiment of the present invention.

DETAILED DESCRIPTION OF PREFERRED EMBODIMENTS

First Preferred Embodiment

A configuration of a dual-band switching circuit module including a high-frequency switching circuit according to a first preferred embodiment of the present invention is described with reference to FIGS. 2 to 6(15).

Figure 2:
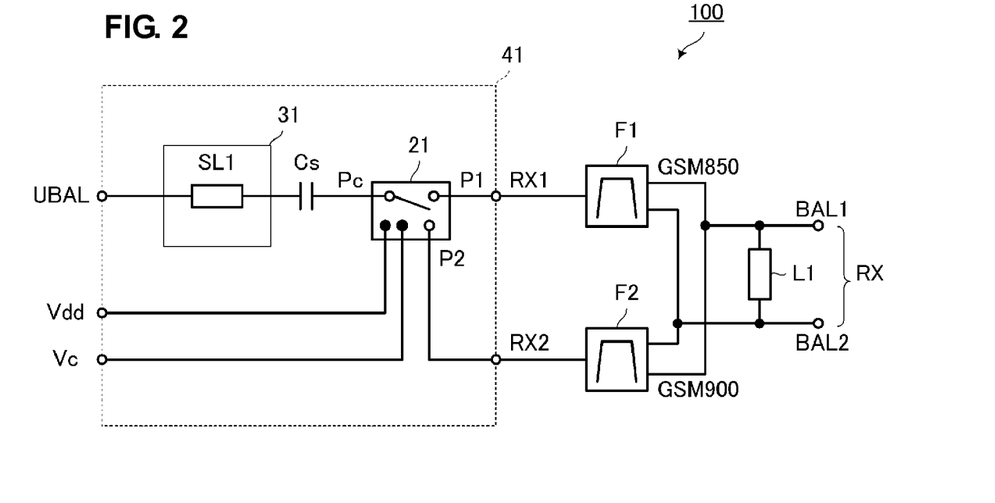
FIG. 2 is a circuit diagram of a high-frequency switching circuit module according to a first preferred embodiment of the present invention.

FIG. 2 is a circuit diagram of a switching circuit module 100 including a high-frequency switching circuit according to the first preferred embodiment. The switching circuit module is a circuit that switches between GSM-850/GSM-900 reception signals from an unbalanced terminal UBAL and outputs a selected signal in accordance with a frequency band. The switching circuit module 100 includes a high-frequency switching circuit 41, surface-acoustic-wave (SAW) filters F1 and F2, and an inductor L1.

The high-frequency switching circuit 41 includes a high-frequency switch 21 and a matching circuit 31. The high-frequency switch 21 includes a field-effect transistor (FET) switching element and selectively connects between a common input/output terminal Pc and one of two input/output terminals P1 and P2. The matching circuit 31 includes a matching strip line SL1 and is connected between the common input/output terminal Pc of the high-frequency switch 21 and the unbalanced terminal UBAL.

A first reception-signal output port RX1 of the high-frequency switching circuit 41 (the first input/output terminal P1 of the high-frequency switch 21) is connected to an unbalanced terminal of the first SAW filter F1. The first SAW filter F1 allows a GSM-850 reception signal to pass therethrough. Similarly, a second reception-signal output port RX2 (the second input/output terminal P2 of the high-frequency switch 21) is connected to an unbalanced terminal of the second SAW filter F2. The second SAW filter F2 allows a GSM-900 reception signal to pass therethrough.

A balanced terminal of the first SAW filter F1 and that of the second SAW filter F2 are mutually connected, and an inductor L1 serving as a balance coil is connected between balanced terminals BAL1 and BAL2.

A power supply voltage input into a power-supply terminal Vdd of the high-frequency switching circuit 41 is applied to the high-frequency switch 21. A control voltage input into a control terminal Vc is applied to the high-frequency switch 21.

Figure 3:
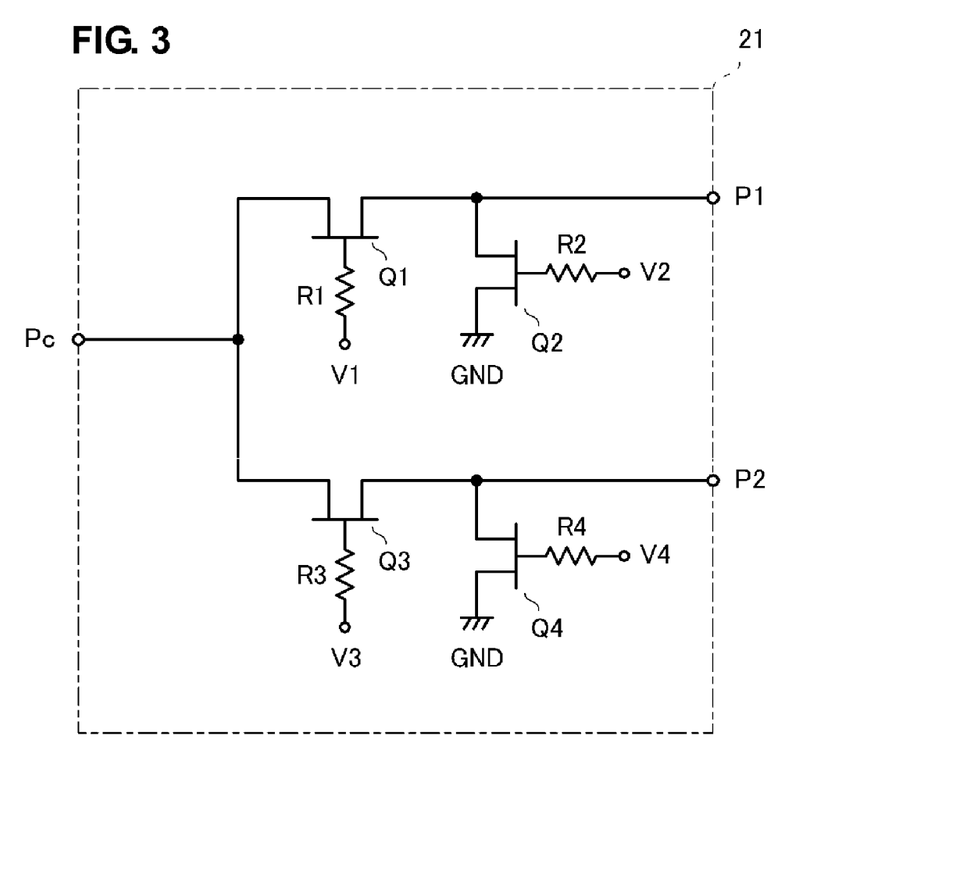
FIG. 3 is a circuit diagram of a high-frequency switch used in the high-frequency switching circuit module according to the first preferred embodiment of the present invention.

FIG. 3 is a circuit diagram that illustrates a specific configuration of the high-frequency switch 21 illustrated in FIG. 2. A FET Q1 is connected in series and a FET Q2 is connected in shunt between the common input/output terminal Pc and the first input/output terminal P1. The FETs Q1 and Q2 have gates to which control voltages V1 and V2 are applied through resistors R1 and R2, respectively. Similarly, a FET Q3 is connected in series and a FET Q4 is connected in shunt between the common input/output terminal Pc and the second input/output terminal P2. The FETs Q3 and Q4 have gates to which control voltages V3 and V4 are applied through resistors R3 and R4, respectively.

In FIG. 3, the control voltages V1 to V4 are applied such that, when the FETs Q1 and Q4 are in an on state, the FETs Q2 and Q3 are in an off state, and in contrast, when the FETs Q2 and Q3 are in an on state, the FETs Q1 and Q4 are in an off state.

Figure 4A:
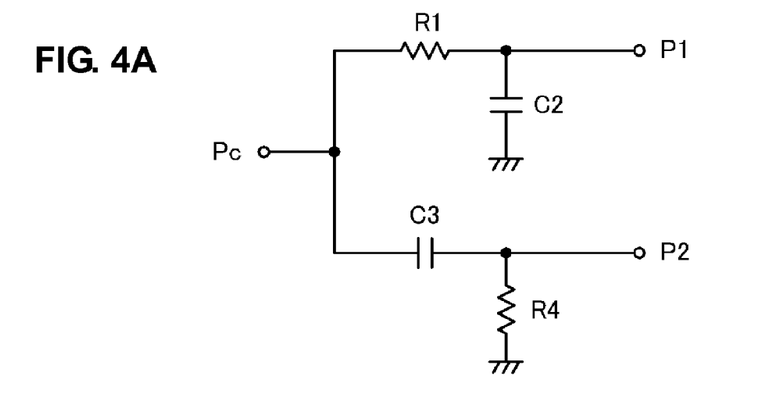
FIGS. 4A to 4D illustrate equivalent circuit diagrams of the high-frequency switch and a matching circuit.
Figure 4B:
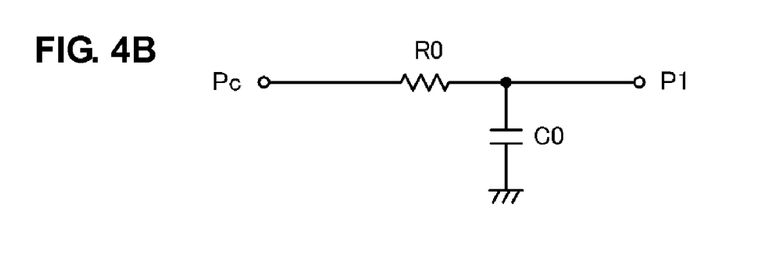

FIGS. 4A to 4D illustrate equivalent circuit diagrams when the FETs Q1 and Q4 are in an on state and the FETs Q2 and are in an off state in the high-frequency switch 21 illustrated in FIG. 3. The FETs in an on state are represented by the resistors R1 and R4, and the FETs in an off state are represented by capacitors C2 and C3. Accordingly, this state indicates a parallel circuit of a series circuit of R1 and C2 and a series circuit of C3 and R4 and can be represented by a circuit defining a series circuit of a resistor R0 and a capacitor C0 between the common input/output terminal Pc and the ground, as illustrated in FIG. 4B.

The same applies to a situation where the FETs Q1 and illustrated in FIG. 3 are in an off state and the FETs Q2 and are in an on state.

Figure 4C:
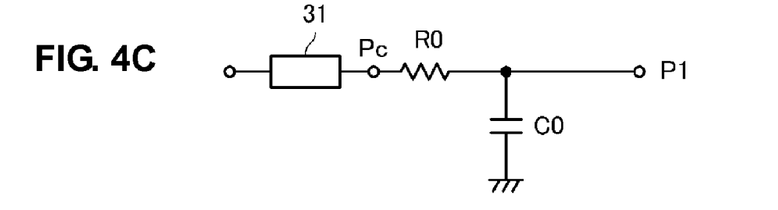
Figure 4D:
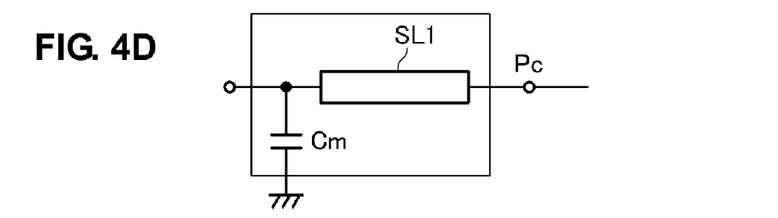
Figure 5:
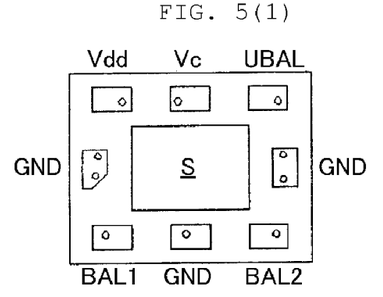
Figure 6:
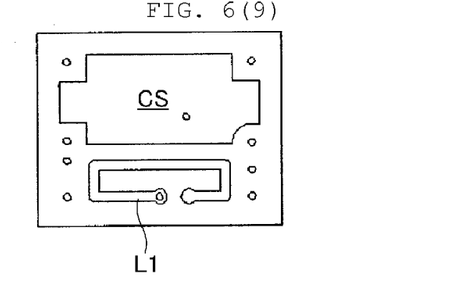

The existence of an input/output terminal that is not selected allows the non-selected input/output terminal (port) to act as a capacitor, thus causing a displacement of the impedance between the common input/output terminal and a selected input/output terminal from a normal impedance (about 50Ω). To correct the capacitance C0 disposed in parallel between the line and the ground in this circuit and make the impedance viewed from the common input/output terminal Pc to the high-frequency switch 21 substantially equal to the normal impedance, the matching circuit 31 is provided, as illustrated in FIG. 4C. The matching circuit 31 illustrated in FIG. 2 is a circuit that is determined in this manner.

The above-described matching circuit may also include the matching strip line SL1 and a capacitor Cm connected in shunt with the signal line. The capacitor Cm allows the impedance to be determined by the inductance of the strip line SL1 and the capacitance of the capacitor Cm. Accordingly, the design freedom for the matching circuit is improved.

Determining the impedance of the matching circuit 31 so as to cancel an impedance mismatch caused by an electric capacitance in the SAW filters F1 and F2 when designing the high-frequency switch 21 eliminates the necessity to provide each of the SAW filters F1 and F2 with the matching circuit. This enables a small overall size of the high-frequency circuit including the SAW filters and a reduced insertion loss.

FIGS. 5(1) to 6(15) illustrate specific examples of electrode patterns disposed on dielectric layers when the switching circuit module illustrated in FIG. 2 is provided in a multilayer substrate.

In FIGS. 5(1) to 6(15) represent dielectric layers of the multilayer substrate in sequence. FIG. 5(1) indicates the lowermost dielectric layer, and FIG. 6(15) indicates the uppermost dielectric layer. FIGS. 5(1) to 6(15) illustrate the dielectric layers viewed from a bottom side (a side facing a mounting board). The electrode pattern illustrated in FIG. 6(15) is disposed at an upper surface side of the dielectric layer.

The terminals (GND, Vdd, Vc, UBAL, BAL1, BAL2) used for mounting on a mounting board are provided on the lowest dielectric layer as shown in FIG. 5(1). These terminals correspond to the terminal having the same names illustrated in FIG. 2.

Each of the dielectric layers shown in FIG. 5(1) to FIG. 5(5) has a cavity S. The high-frequency switch 21 is mounted at the front side of the dielectric layer shown in FIG. 5(6) not by wire bonding but by flip-chip bonding. The high-frequency switch 21 is thus arranged in the cavity.

Each of the dielectric layers shown in FIG. 5(5) to FIG. 5(8) includes the matching strip line SL1. Each of the dielectric layers shown in FIG. 6(9) to FIG. 6(13) includes an electrode of the capacitor Cs.

Each of the dielectric layers shown in FIG. 5(8) to FIG. 6(13) includes the inductor L1 defined by a balance coil.

The dielectric layer shown in FIG. 6(15) includes the two SAW filters F1 and F2 at its front side.

In such a manner, the switching circuit module illustrated in FIG. 2 is provided on the multilayer substrate, and the dual-band switching circuit module for GSM-850 and GSM-900 is configured.

In the first preferred embodiment, the high-frequency switch 21 is preferably mounted in the cavity provided in the front side of the multilayer substrate by flip-chip bonding. However, the high-frequency switch may also be arranged in a cavity provided in the underside of the multilayer substrate.

Second Preferred Embodiment

A configuration of a triple-band switchplexer including a high-frequency switching circuit according to a second preferred embodiment of the present invention is described with reference to FIGS. 7 to 9(13).

Figure 7:
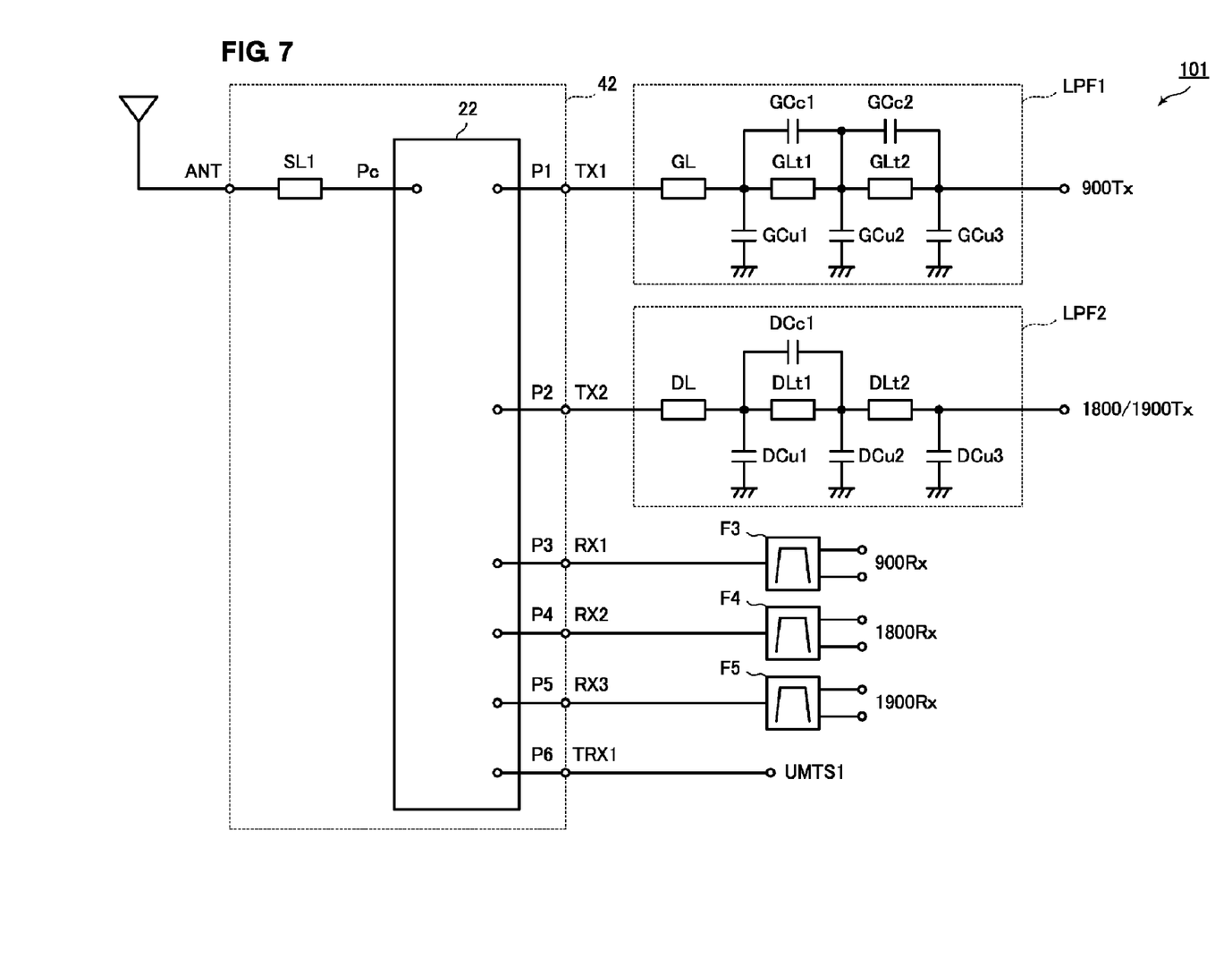
FIG. 7 illustrates a configuration of a high-frequency switching circuit module according to a second preferred embodiment of the present invention.
Figure 8:
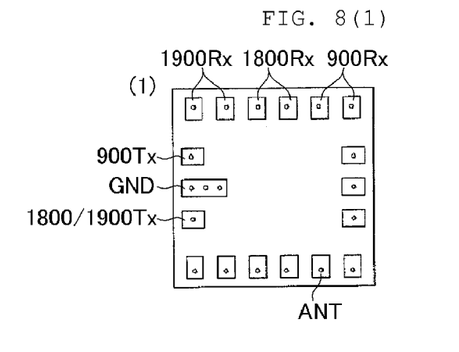
Figure 9:
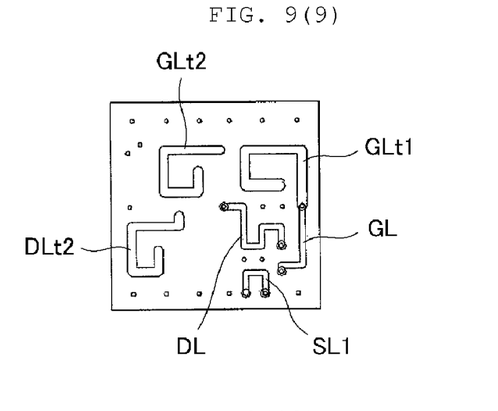

FIG. 7 is a circuit diagram of a switchplexer 101 according to the second preferred embodiment. The switchplexer 101 includes a high-frequency switching circuit 42, low-pass filters LPF1 and LPF2, and SAW filters F3, F4, and F5.

The high-frequency switching circuit 42 includes a high-frequency switch 22 and a strip line SL1 to define a matching circuit. The high-frequency switch 22 selectively connects between a common input/output terminal Pc and any one of a plurality of input/output terminals P1 to P6. A control terminal and a power-supply terminal to perform this switching are omitted in FIG. 7. The high-frequency switch 22 is provided with the matching strip line SL1 disposed between the common input/output terminal Pc and an antenna terminal ANT of the high-frequency switching circuit 42.

The low-pass filter LPF1 allows a signal at a GSM-900 transmission-signal frequency band among input signals from a GSM-900 transmission-signal input terminal 900Tx to pass therethrough. Similarly, the low-pass filter LPF2 allows a signal at a GSM-1800/1900 transmission-signal frequency band among input signals from a GSM-1800/1900 transmission-signal input terminal 1800/1900Tx to pass therethrough.

The low-pass filter LPF1 includes strip lines GL, GLt1, and GLt2 and capacitors GCc1, GCc2, GCu1, GCu2, and GCu3. Similarly, the low-pass filter LPF2 includes strip lines DL, DLt1, and DLt2 and capacitors DCc1, DCc2, DCu1, DGCu2, and DCu3.

The SAW filter F3 allows a signal at a GSM-900 reception-signal frequency band with respect to signals from a reception-signal output port RX1 of the high-frequency switching circuit 42 to pass therethrough. The SAW filter F4 allows a signal at a GSM-1800 reception-signal frequency band with respect to signals from a reception-signal output port RX2 of the high-frequency switching circuit 42 to pass therethrough. Similarly, the SAW filter F5 allows a signal at a GSM-1900 reception-signal frequency band with respect to signals from a reception-signal output port RX3 of the high-frequency switching circuit 42 to pass therethrough.

A transmission and reception signal port TRX1 of the high-frequency switching circuit 42 is connected to a UMTS1 circuit.

FIGS. 8(1) to 9(13) illustrate specific examples of electrode patterns disposed on dielectric layers when the switchplexer illustrated in FIG. 7 is formed in a multilayer substrate.

In FIGS. 8(1) to 9(13) represent dielectric layers of the multilayer substrate in sequence. FIG. 8(1) indicates the lowermost dielectric layer, and FIG. 9(13) indicates the uppermost dielectric layer. FIGS. 8(1) to 9(13) illustrate the dielectric layers viewed from a bottom side (a side facing a mounting board). The electrode pattern illustrated in FIG. 9(13) is disposed at an upper surface side of the dielectric layer.

The terminals (GND, 1900Rx, 1800Rx, 900Rx, 1800/1900Tx, 900Tx, ANT) used for mounting on a mounting board are provided on the lowermost dielectric layer shown in FIG. 8(1). These terminals correspond to the terminal having the same names illustrated in FIG. 7.

Each of the dielectric layers shown in FIGS. 8(2) and 9(11) includes a ground electrode G.

Each of the dielectric layers shown in FIGS. 8(3), 8(4), and 9(10) has the capacitor electrodes GCu2, GCu3, DCu2, DCu3, GCc1, GCc2, DCc1, GCu1, and DCu1.

Each of the dielectric layers shown in FIGS. 8(6) to (9) includes the strip lines DLt1, GLt1, GLt2, DLt2, GL, and DL.

The dielectric layer shown in FIG. 9(9) includes the matching strip line SL1.

The high-frequency switch 22 is mounted at the front side of the dielectric layer shown in FIG. 9(13) not by wire bonding but by flip-chip bonding.

In such a manner, the switchplexer illustrated in FIG. 7 is disposed in the multilayer substrate, and the triple-band switchplexer for GSM-900/GSM-1800/GSM-1900 is configured.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A high-frequency switching circuit module comprising:
   a common input/output terminal;
   a plurality of input/output terminals;
   a high-frequency switch including a field-effect transistor switching element and being arranged to be selectively connected between the common input/output terminal and one of the plurality of input/output terminals;
   a multilayer substrate including a plurality of stacked dielectric layers and wiring electrodes; and
   a matching circuit; wherein
   the high-frequency switch includes a semiconductor chip and is arranged on at least one major surface of the multilayer substrate by flip-chip mounting via a bump portion;
   the matching circuit is disposed between the common input/output terminal and a circuit connected to the common input/output terminal and is not disposed between the plurality of input/output terminals and a circuit connected to each of the plurality of input/output terminals; and
   the matching circuit includes an inductor that is defined in the bump portion;
   the inductor is connected to the common input/output terminal and to an on-state input/output terminal of the switching element; and
   impedance matching between the common input/output terminal and the on-state input/output terminal is provided by correcting an electric capacitance in all of the plurality of input/output terminals of the switching element in an off-state.

2. The high-frequency switching circuit module according to claim 1, wherein the inductor is arranged in series between the common input/output terminal and the circuit connected to the common input/output terminal.

3. The high-frequency switching circuit module according to claim 2, wherein the matching circuit further includes a capacitor connected in shunt.

4. The high-frequency switching circuit module according to claim 1, wherein
   the inductor is provided on a first major surface of the multilayer substrate or inside the multilayer substrate.

5. The high-frequency switching circuit module according to claim 1, wherein
   the inductor is a chip inductor; and
   the chip inductor is provided on a first major surface of the multilayer substrate or inside the multilayer substrate.

6. The high-frequency switching circuit module according to claim 4, wherein a cavity is provided in a second major surface of the multilayer substrate opposite to the first major surface, and the semiconductor chip is arranged in the cavity.

7. The high-frequency switching circuit module according to claim 1, wherein the circuit connected to at least one of the plurality of input/output terminals includes a surface acoustic wave filter.

* * * * *